(12) United States Patent
Chou et al.

(10) Patent No.: US 6,633,500 B1
(45) Date of Patent: Oct. 14, 2003

(54) SYSTEMS AND METHODS FOR REFRESHING A NON-VOLATILE MEMORY USING A TOKEN

(75) Inventors: Ming-Hung Chou, Hsinchu (TW); Chia Hsing Chen, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/134,561

(22) Filed: Apr. 26, 2002

(51) Int. Cl.[7] .............................................. G11C 16/00
(52) U.S. Cl. .................................. 365/185.25; 365/222
(58) Field of Search ........................ 365/185.25, 222, 365/185.33

(56) References Cited

U.S. PATENT DOCUMENTS

| | | | |
|---|---|---|---|
| 5,365,486 A | 11/1994 | Schreck | 365/222 |
| 5,574,684 A * | 11/1996 | Tomoeda | 365/185.25 |
| 5,765,185 A | 6/1998 | Lambrache et al. | 711/103 |
| 5,768,193 A * | 6/1998 | Lee et al. | 365/185.25 |
| 5,909,449 A | 6/1999 | So et al. | 371/21.4 |
| 6,088,268 A | 7/2000 | Gupta et al. | 365/185.25 |
| 6,108,241 A * | 8/2000 | Chevallier | 365/185.33 |
| 6,493,270 B2 * | 12/2002 | Chevallier | 365/185.33 |

* cited by examiner

Primary Examiner—Tan T. Nguyen
(74) Attorney, Agent, or Firm—Knobbe, Martens, Olson & Bear LLP

(57) ABSTRACT

The present invention is related to methods and systems for refreshing non-volatile memories. A refresh token associated with a first wordline is located. A determination is made as to whether a first cell current for a first cell coupled to the first wordline is within a first range. At least partly in response to determining that the first cell current is within the first range, the first cell is refreshed.

22 Claims, 8 Drawing Sheets

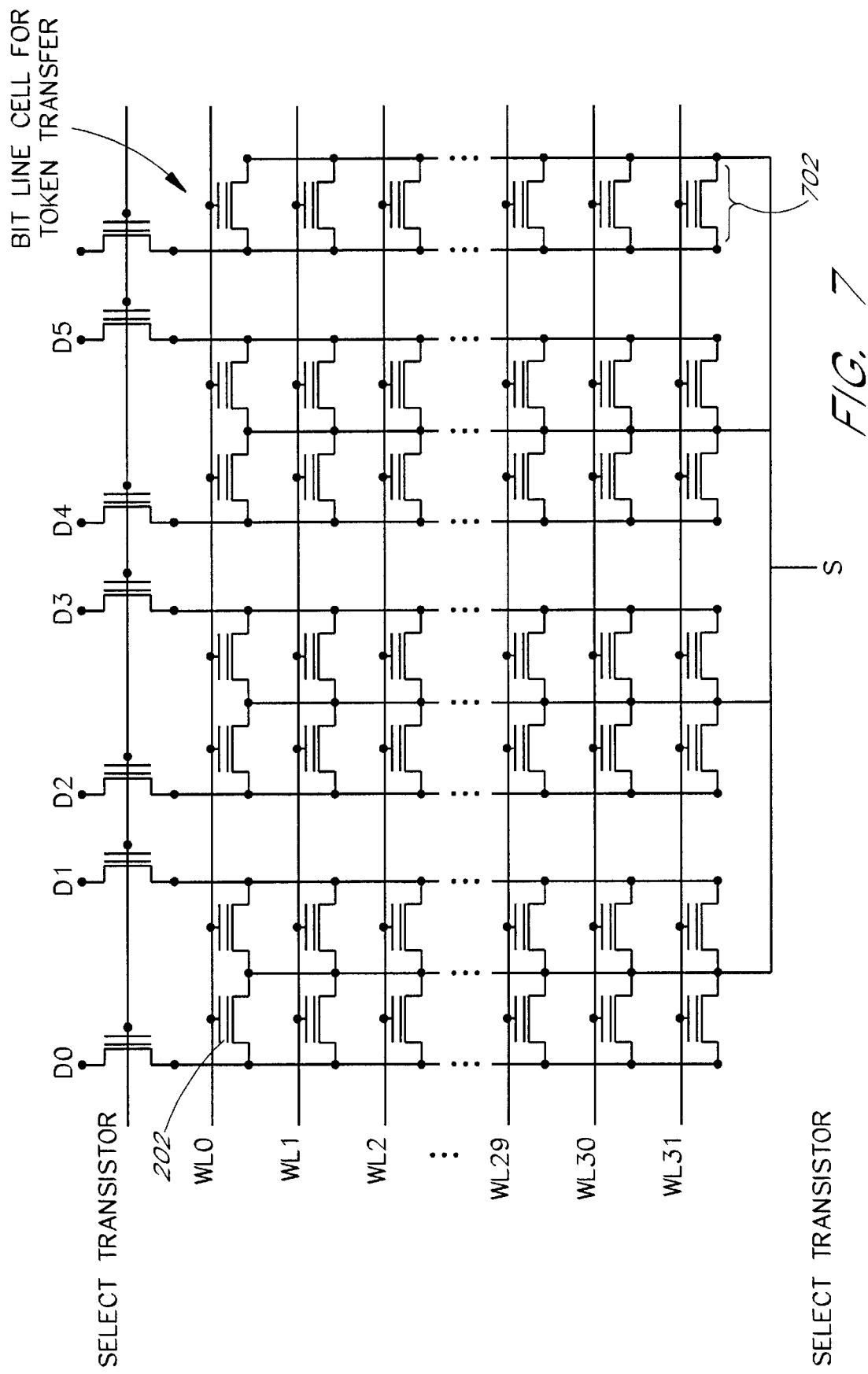

SYSTEMS AND METHODS FOR REFRESHING A NON-VOLATILE MEMORY USING A TOKEN

BACKGROUND OF THE INVENTION

1. Field of the Invention

The present invention relates to non-volatile, rewritable memory and in particular, to methods and systems for refreshing non-volatile, rewritable memory arrays.

2. Description of the Related Art

In a typical FLASH memory array, the memory cells are arranged in a rectangular array of rows and columns to form intersections at which there are disposed memory cell transistors. The drain of each transistor is connected to a corresponding bit line, the source of each transistor is connected to an array source voltage by an array source line, and the gate of each transistor is connected to a wordline.

Typical FLASH memories allow cells to programmed, read or erased in bulk, sectors or pages. In addition, some FLASH memories can be operated in an EEPROM mode, where from the user perspective, cells can be programmed, read or erased on a byte basis. Cells are conventionally programmed by driving selected bitlines connected to the memory cell transistor drains to a first voltage and driving the gates of the memory cell transistors connected to selected wordlines to a second higher voltage to perform hot electron injection.

The erasure of FLASH memory cell data is performed by driving the gate of a memory cell transistor to a voltage that is substantially less than a voltage placed on the bitline. In doing so, electrons are tunneled off of the floating gate of the memory cell transistor. By way of example, the erase operation can be performed as a bulk erase, which erases the entire FLASH memory array, a sector erase, which erases a FLASH memory array sector, or a page erase, which erases a single sector row. If the FLASH memory can be operated in an EEPROM mode, then the erasure can, from the user perspective, be performed on a byte basis.

However, FLASH memories are subject to a disturb phenomenon during erase and program operations. Because memory cells may share the same bitlines across sectors, voltages placed on these bitlines produce electrical field effects on the sectors sharing the bitlines. Furthermore, memory cells within different sectors may share wordlines, and voltages on these shared wordlines create field effects in the sectors sharing them.

The electric fields generated on the shared bitlines and wordlines may have the effect of inadvertently erasing programmed bits or programming erased bits. For example, raising the voltage on a wordline to program an erased bit may disturb a previously programmed bit on the same wordline by removing some electrons from the floating gate to the control gate of the previously programmed bit. Thus, the sector cells need to be refreshed after each erase or program operation or after a predetermined number of erase or program cycles.

One conventional technique for performing refresh operations is to perform a refresh on an entire sector after each erase/program operation, where the contents of the sector to be refreshed are buffered and then rewritten. However, the buffer used to store the sector contents utilizes a significant amount of area and so the sector size may need to be constrained to reduce the buffer size. Another conventional technique for determining when to perform a refresh operation is to count the number of erase or program cycles using a counter, and performing a refresh after a predetermined number of cycles. However, such counters are often of insufficient reliability. Hence these conventional refresh techniques fail to provide a refresh process that is both efficient and reliable.

SUMMARY OF THE INVENTION

The present invention is directed to methods and systems for refreshing non-volatile memories, such as FLASH memories that can be operated in an EEPROM mode. In particular, one embodiment of the present invention embeds a refresh process in a write operation using a refresh token to identify which cells are to be evaluated to determine if the cells are to refreshed.

Using an embodiment of the present invention, if the cells associated with a given wordline can sustain more than N cycles without needing to be refreshed, then 1/N sectors can be sequentially refreshed after each erase or program operation. This is in contrast to some conventional techniques which refresh an entire sector after each erase or program operation. Advantageously, the present invention reduces the size needed for a refresh buffer and enables enlargement of the sector size by a factor N, without use of a refresh cycle counter.

A refresh indicator or signal is recorded using a nonvolatile bit, termed a "token," or a "refresh token" associated with a wordline to identify that the cells coupled to the wordline are to be inspected so as to determine if the cells are to refreshed or not. If the token is set, the corresponding cells have their cell current measured.

If the cell current meets a predetermined criteria, the cell is refreshed. Thus, rather then refreshing every cell within a sector when performing a refresh operation, the refresh operation is performed on those cells whose cell current falls within a predetermined range.

The refresh operation can be embedded in a write operation. After each write operation, the token is transferred sequentially among wordline drivers, whether or not the wordline is selected in an erase or program portion of the write operation. In particular, the write operation includes 3 embedded operations: an erase operation, a program operation, and a refresh operation. During the refresh operation, a FLASH cell floating gate is charged using Channel Hot Electron injection (CHE) by providing a high bias on the gate and an elevate bias on the drain.

BRIEF DESCRIPTION OF THE DRAWINGS

FIG. 4 is a block diagram on an example refresh circuit in accordance woth one embodiment of the present invention.

FIG. 7 illustrates a schematic of an example portion of a FLASH memory circuit, including a token storage circuit.

Throughout the drawings, like reference numbers are used to reference items that are identical or functionally similar.

For purposes of summarizing the invention, certain aspects, advantages and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF PREFERRED EMBODIMENTS

Embodiments of the present invention are related to methods and systems for refreshing re-writable non-volatile solid-state memory memories using a refresh token. In particular, a refresh signal associated with a memory array row is used to determine which cells are to be refreshed. As is described in greater detail below, in one embodiment the refresh signal is recorded by a nonvolatile bit, also termed a "token," which uses a "flag" or status of a word line bit to indicate whether a given portion of memory is to be evaluated to determine if it is to be refreshed or not.

Advantageously, rather then refreshing every cell within a sector when a refresh operation is performed, the refresh operation is performed when a given cell's cell current falls within a predetermined range. Thus, the refresh process is both quicker and utilizes less buffer space than many conventional approaches. Optionally, the refresh process is embedded in a write or a rewrite operation that further includes erase and program operations. The token is transferred sequentially among wordlines, even if the wordline has not been selected during the erase or program operations.

It will be understood that the circuits, voltage, currents, and the like described below are for illustrative purposes only. Thus, the invention may be embodied or carried out using other circuits, voltages and/or currents.

Figure 1:
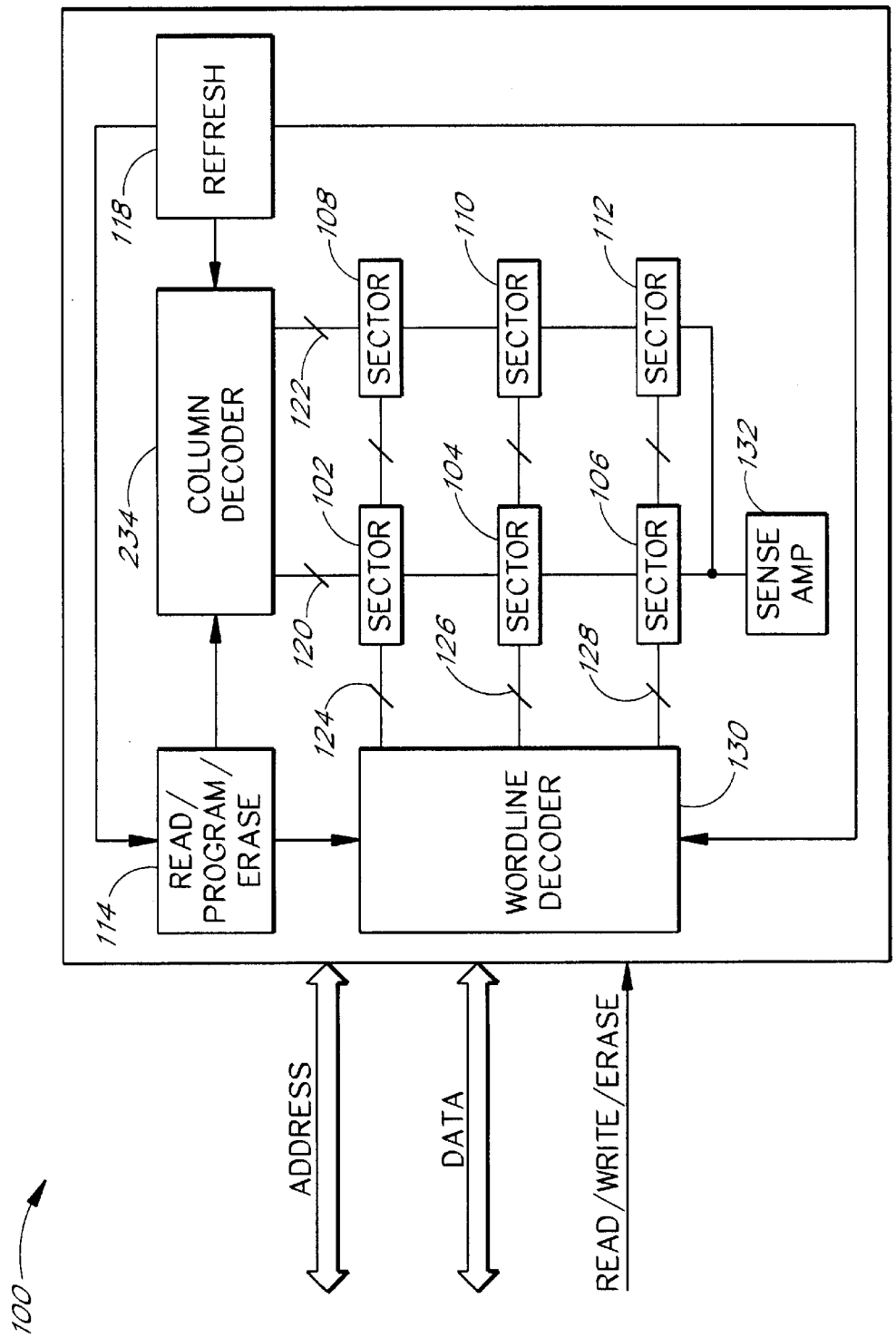
FIG. 1 illustrates an example block diagram of a FLASH memory circuit in accordance with one embodiment of the present invention.

FIG. 1 illustrates an example block diagram of a portion of a non-volatile memory circuit 100 in accordance with one embodiment of the present invention. Advantageously, the memory circuit is configured to act in both EEPROM and FLASH memory modes. In the EEPROM mode, data can be written a byte at a time, while in FLASH mode, data can be written a sector or page at a time. The memory circuit 100 includes a plurality of sectors 102, 104, 106, 108, 110, 112 of memory cells coupled to a column decoder 134 and a wordline decoder 112. Sectors 102, 104, 106 share common bitlines 120 from the column decoder 134 and sectors 108, 110, 112 share common bitlines 122 from the column decoder 134. Sectors 102 and 108 share common wordlines 124 from wordline decoder 130, sectors 104 and 110 share common wordlines 126 from the wordline decoder 130, and sectors 106 and 112 share common wordlines 128 from the wordline decoder 130. More generally, each wordline represents one of M rows, wherein each of the M rows has N words. The number of bitlines is the same as the number of N words in a row multiplied by the number of bits in each word.

An Erase/Program/Read circuit 114 is coupled to the column decoder 134 and the wordline decoder 130. A refresh circuit 118 is coupled to the Erase/Program/Read circuit 114, the column decoder 134, and the wordline decoder 130. As described in greater detail below the refresh circuit 118 is used to appropriately refresh cells to ensure that disturb conditions do alter data. A disturb condition can arise because memory cells share the same bitlines across sectors, so that voltages placed on these bitlines produce electrical field effects on the sectors sharing the bitlines. A disturb condition can also arise because memory cells within different sectors may share wordlines, and voltages on these shared wordlines create field effects in the sectors sharing them. Thus, erasing one sector can inadvertently cause the values of bits in other sectors to change, and so a refresh operations needs to be performed so that the values do not inadvertently change.

Figure 2:
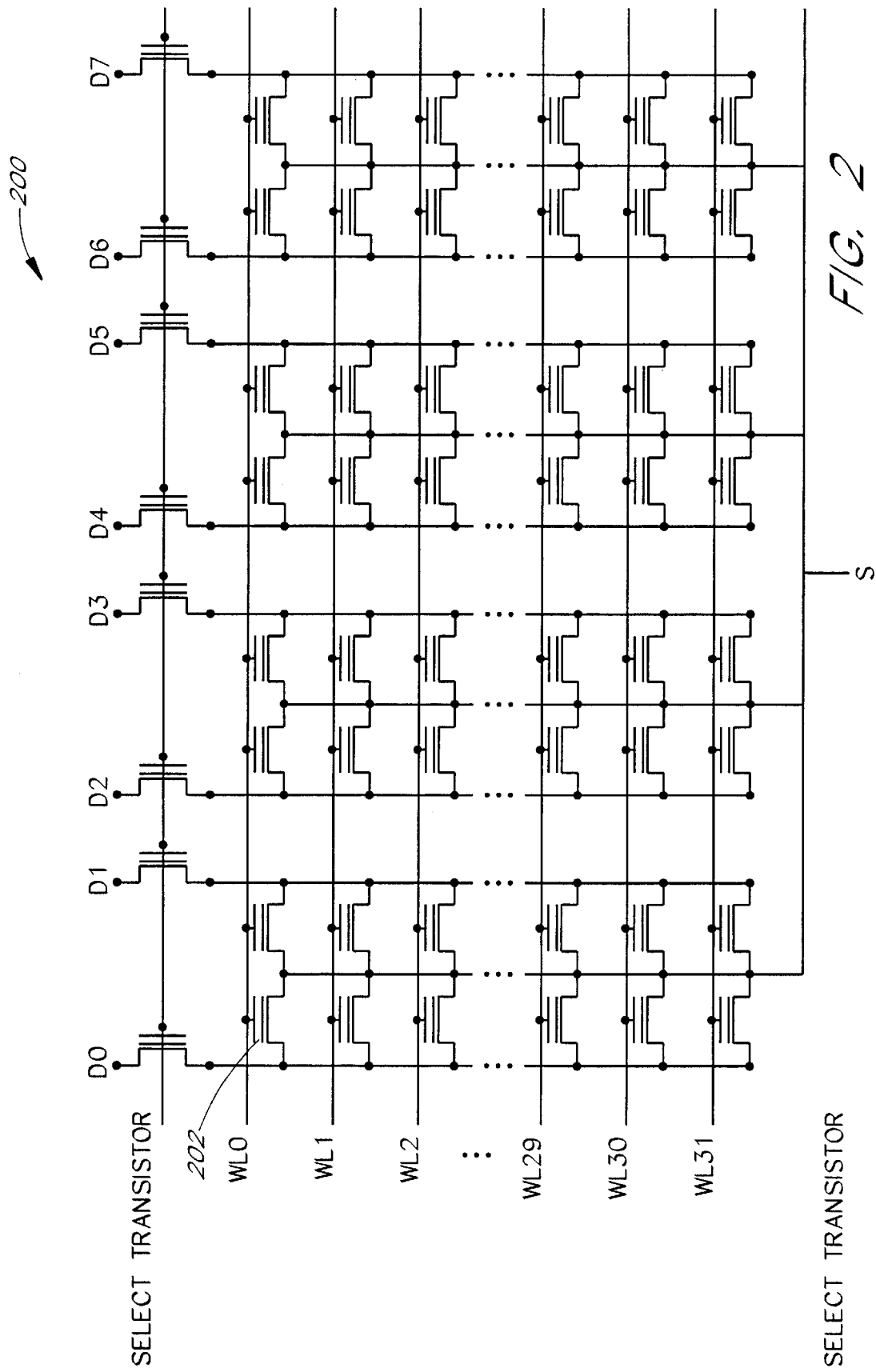
FIG. 2 illustrates a schematic of an example portion of a FLASH memory circuit.

FIG. 2 illustrates a schematic of an example portion 200 of a FLASH memory circuit sector, such as sector 102 illustrated in FIG. 1. The example sector includes 32 cells per bit line and has 32 wordlines (WL), with 256 bytes connected to the same wordline driver. Each memory cell is coupled to one wordline and one bitline. For each of the cells disposed at the intersection of a wordline and a bit line, the drain of the cell is connected to the bit line, the source of the cell is connected to an array source voltage by an array source line, and the gate of the cell is connected to the wordline. For example, memory cell 202 has a control gate coupled to wordline 204, a drain coupled to bitline 204 and a source connected to the array source line (S). In the example embodiment, the sources of the memory cells within a particular sector are commonly coupled to the array source line (S). A sense amplifier 132, as illustrated in FIG. 1, reads selected bits.

FIG. 7 illustrates an example circuit including a token bit line cell array 702 used to store the refresh token. In the illustrated example, the token bit line cell array 702 is in addition to the main cell array. The token bit line array source can be common with the source of main array. Before the memory circuit 100 is first programmed, the refresh token is associated with the first wordline WL0 by setting the corresponding token bit line cell value to a "0", that is, a high $V_t$, state. A write or rewrite process can then be performed. As described in greater detail below, a rewrite process includes 3 operations: an erase operation, a program operation, and a refresh operation. During the refresh operation, a memory cell floating gate is charged using Channel Hot Electron injection (CHE) by providing a high bias on the gate and an elevated bias on the drain.

Figure 3:
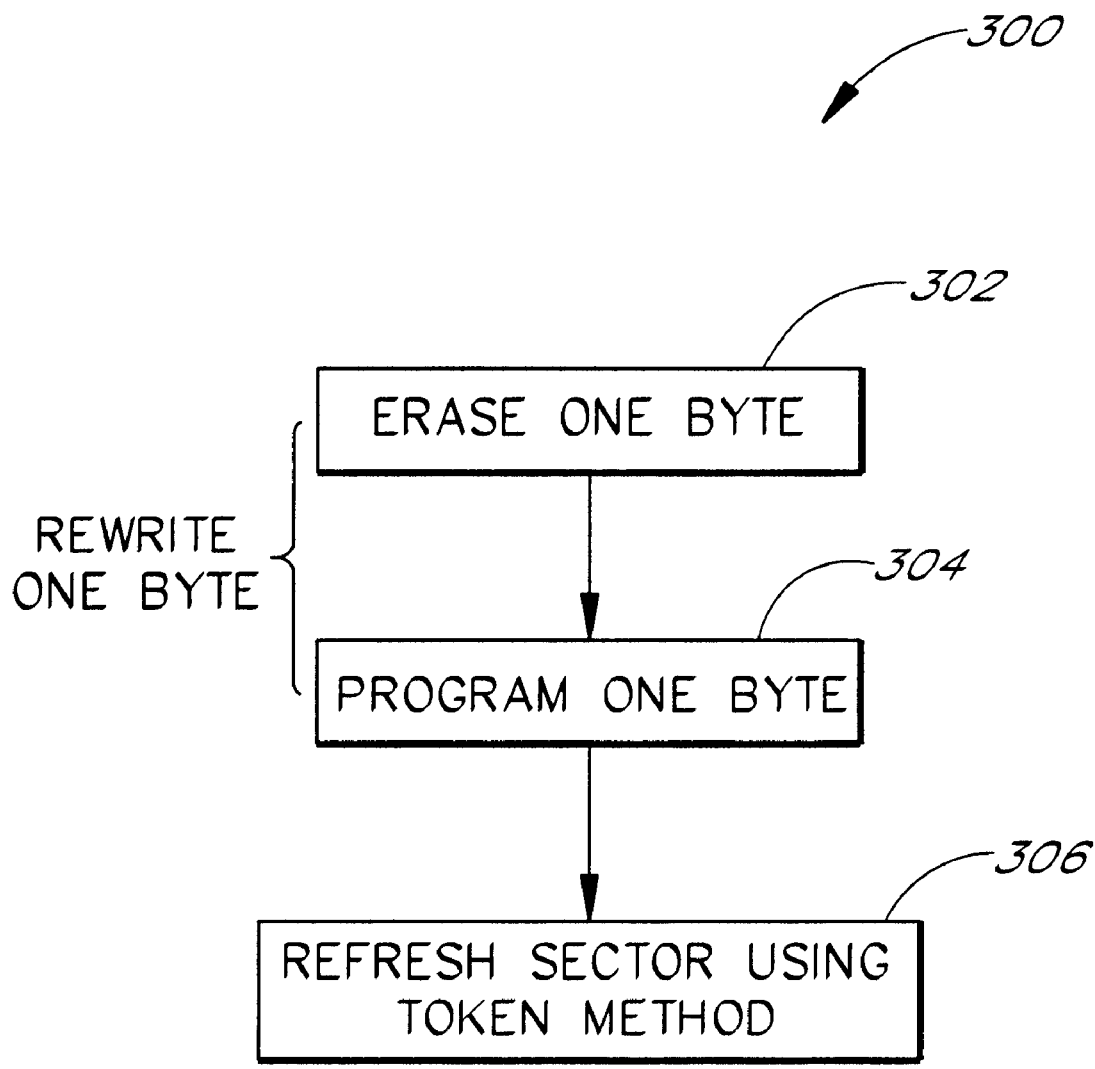
FIG. 3 illustrates a flow diagram of one example method of refreshing a FLASH memory circuit.

FIG. 3 illustrates an example rewrite process 300 used when the non-volatile solid-state memory 100 is being operated in a byte erasable mode. The process 300 is illustrated in greater detail in FIG. 4A, as discussed below. Beginning at state 302, an addressed byte in a first sector is erased. Proceeding to state 304, the addressed byte is then programmed with the desired data. Proceeding to state 306, one row of the first sector is refreshed. The process performed at state 306 is illustrated in greater detail in FIG. 4B, as discussed below. The process 300 then ends at state 308. The refresh process performed at state 306 is illustrated in greater detail in FIG. 5, as discussed below.

Figure 4A:
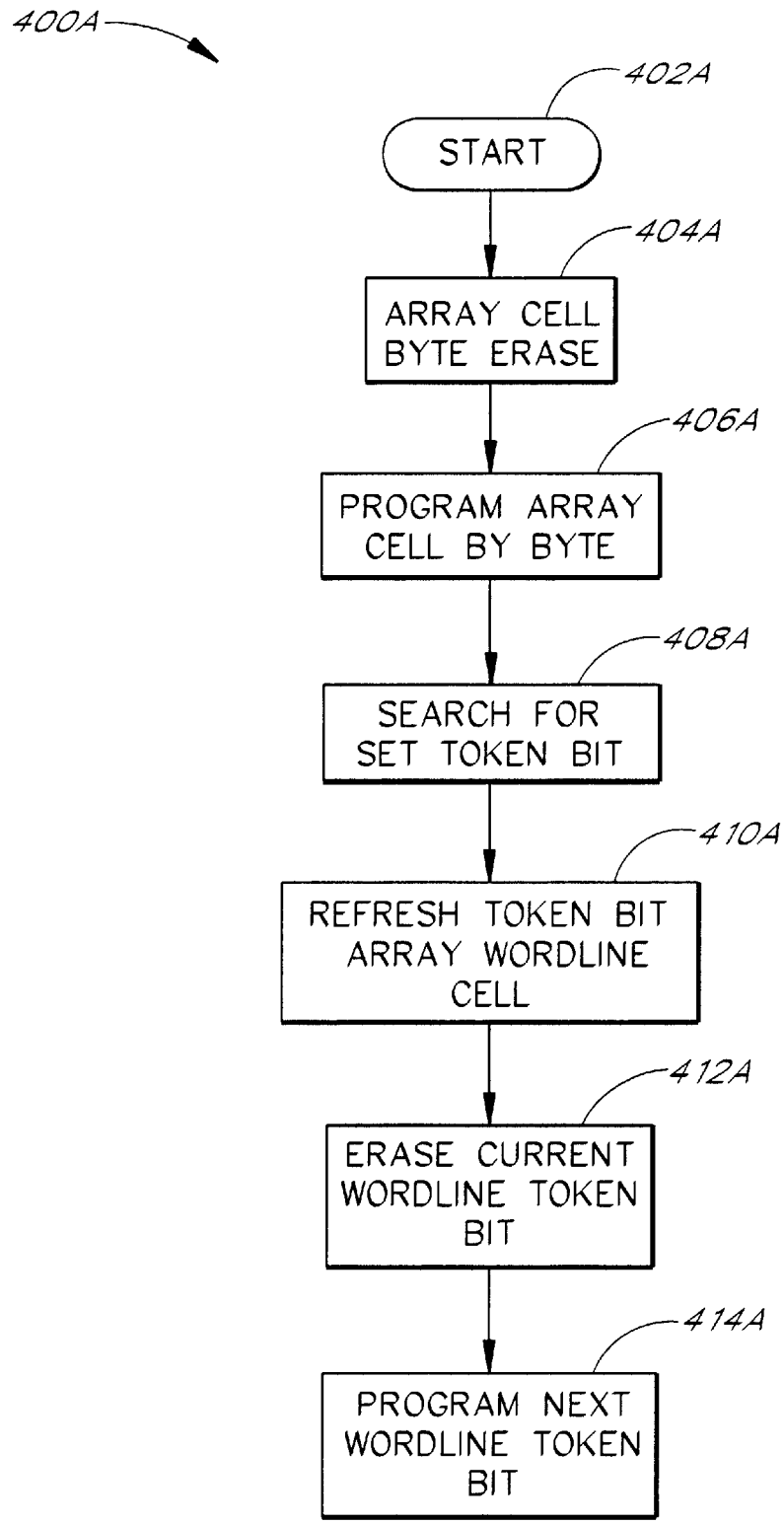
FIGS. 4A–4B illustrate flow diagrams of the example method of refreshing a FLASH memory circuit illustrated in FIG. 3 in greater detail.

Referring to FIG. 4A, the process 400 begins at state 402A and proceeds to state 404A where an array cell byte is erased. The array cell byte is then programmed with the desired data at state 406A. The wordline that currently has the refresh token bit set is search for, located, or otherwise identified at state 408A. In this example, a logic level of "0" indicates that the wordline has the refresh token. In other embodiments, a logic level of "1" can be used to indicate that the wordline has the refresh token. At state 410A, the cells associated with the located wordline are refreshed as discussed in greater detail with respect to FIG. 4B. At state 412A, the current refresh token bit is erased. At state 412A, the sequentially next wordline refresh token bit is set. Thus in one embodiment, the token is passed to a next wordline even if the next wordline will not be selected as part of a next rewrite operation.

Figure 4B:
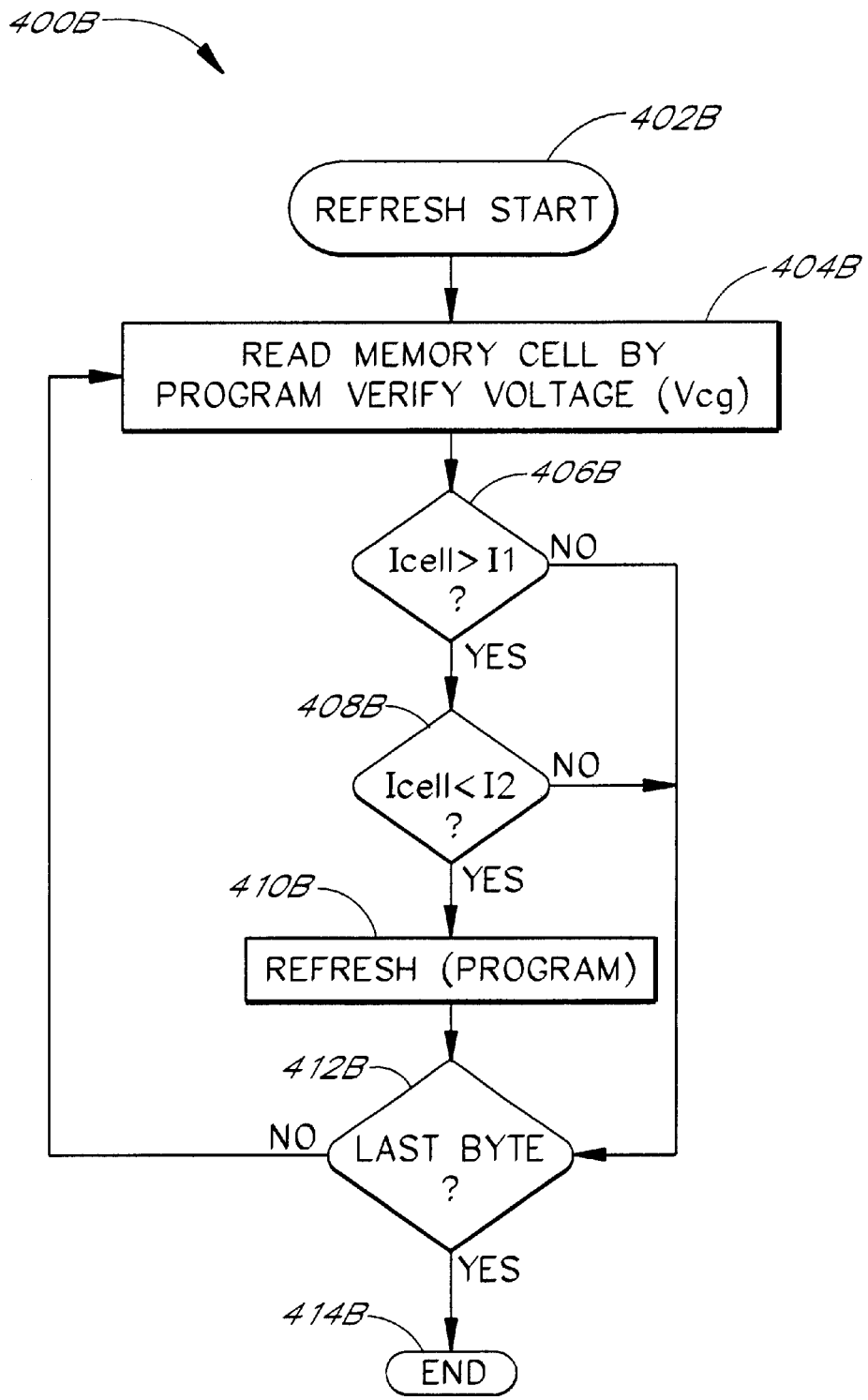

Referring to FIG. 4B, the refresh process 400B is illustrated. As will be discussed, the automatic refresh operation determines if the memory cell or cells has a property, such as current, that has reached a threshold value in a desired range, and if so, performs a refresh of the memory cell or cells. Thus, rather then refreshing every cell within a sector, the refresh operation is performed when the cell current falls within a predetermined range. Starting at state 402B, the process 400B proceeds to state 404B, where the cell gate is set to a program verify voltage level ($V_g$) and the memory cell is read. By way of example, $V_g$ may be set to 7 Volts.

At state 406B the cell current Icell is measured to determine if Icell is greater than a predetermined threshold value I1, which may be, by way of example 20 $\mu$A. If the value of Icell is less than or equal to I1, then a refresh will not be performed and the process 400B proceeds to state 414B. If the value of Icell is greater than I1, then the process 400B proceeds to state 408B. At state 408B the cell current Icell is measured to determine if Icell is less than a predetermined threshold value I2, which may be, by way of example 40 $\mu$A. If the value of Icell is greater than or equal to I2, then a refresh will not be performed and the process 400B proceeds to state 414B. If the value of Icell is less than I2, then the process 400B proceeds to state 410B. At state 410B the refresh operation is performed.

At state 412B a determination is made as to whether the last byte has been rewritten. If it is the last byte, the process 400B ends at state 414B. Otherwise, the process 400B loops back to state 404B and the process is repeated for the next byte. Because not all cells associated with the wordline that has the refresh token are refreshed, the time allocated for the refresh operation is greatly reduced. For example, for some array embodiments, only 1% of the cells need to be refreshed at a given time.

Figure 5:
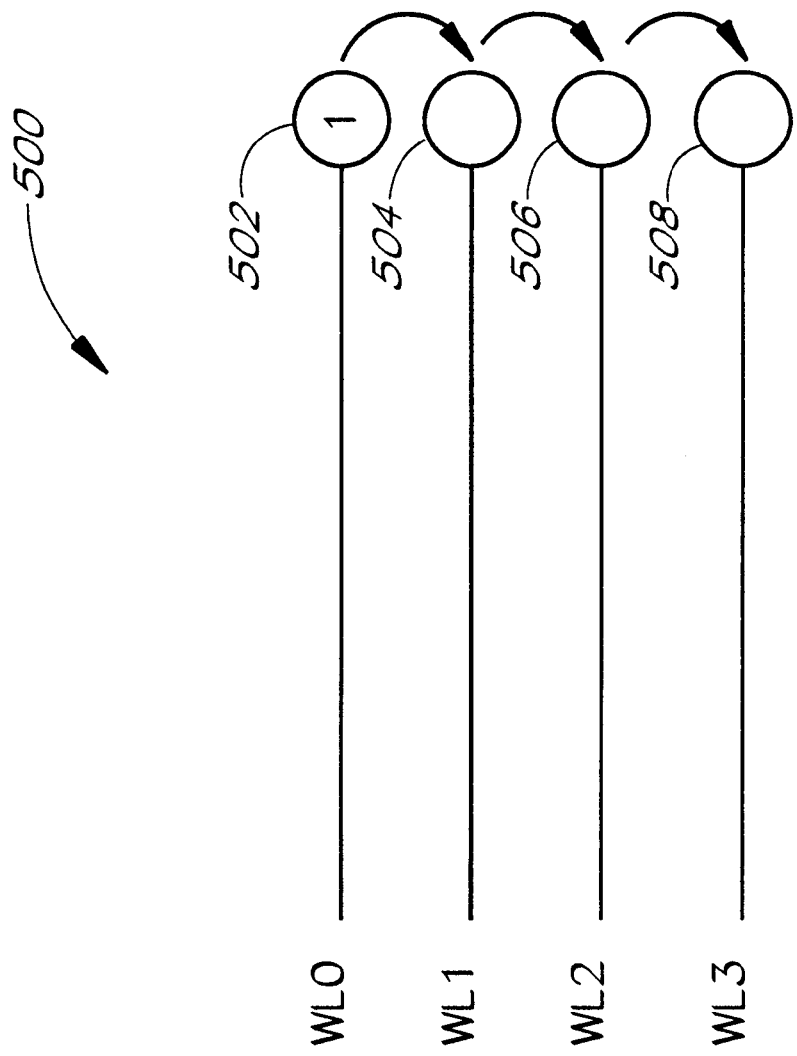
FIG. 5 illustrates an example embodiment of a token passing process.

FIG. 5 illustrates at a high level the token passing process 500. Beginning with wordline WL0, the refresh token bit cell is sequentially transferred from one wordline row to the next or adjacent wordline row whether or not a refresh operation is performed. The token transfer is independent of the rewrite byte location in a given sector. Thus, for example, the wordline that has the refresh token and whose cells are to be refreshed may or may not be associated with the byte to be rewritten. However, the refresh operation is performed within the sector associated with the rewritten byte.

By way of example, using an embodiment of the present invention, if the memory array cells have a 100 cycle associated with the selected bit line and the selected wordline that has the refresh token bit set. If the setup overhead per byte is 1.5 $\mu$s, the refresh time per byte is 1.5 $\mu$s, and 2 wordlines are connected to one wordline driver, with 128 bytes sharing the same wordline, the refresh time is advantageously less than 1 ms.

TABLE 1

|  | PROGRAM | ERASE | DESCRIPTION |
| --- | --- | --- | --- |
| VD | 5 V | Float | VD @ program will disturb cell state from high Vt to low Vt |
| VG | 11 V | −7 V | VG @ erase will disturb cell state from high Vt to low Vt, VG @ program effect is minor |
| VS | 0 V | 6 V | VS @ erase will disturb cell state from high Vt to low Vt |
| VB | 0 V | 0 V | No effect |

Table 1 above includes example EEPROM operation conditions and the corresponding cell effects. A significant area of interest is the cell state in the range from high Vt to low Vt. With the program voltage set to 5V and the erase terminal floated, VD (the drain voltage) at program disturbs the cell state from high Vt to low Vt. With the program voltage set to 11V and the erase terminal set to −7V, VG (the gate voltage) at erase disturbs the cell state from high Vt to low Vt. With the program voltage set to 0V and the erase terminal set to 6V, VS (the source voltage) at erase disturbs the cell state from high Vt to low Vt. With the program voltage set to 0V and the erase terminal set to 0V, there is no effect.

Figure 6:
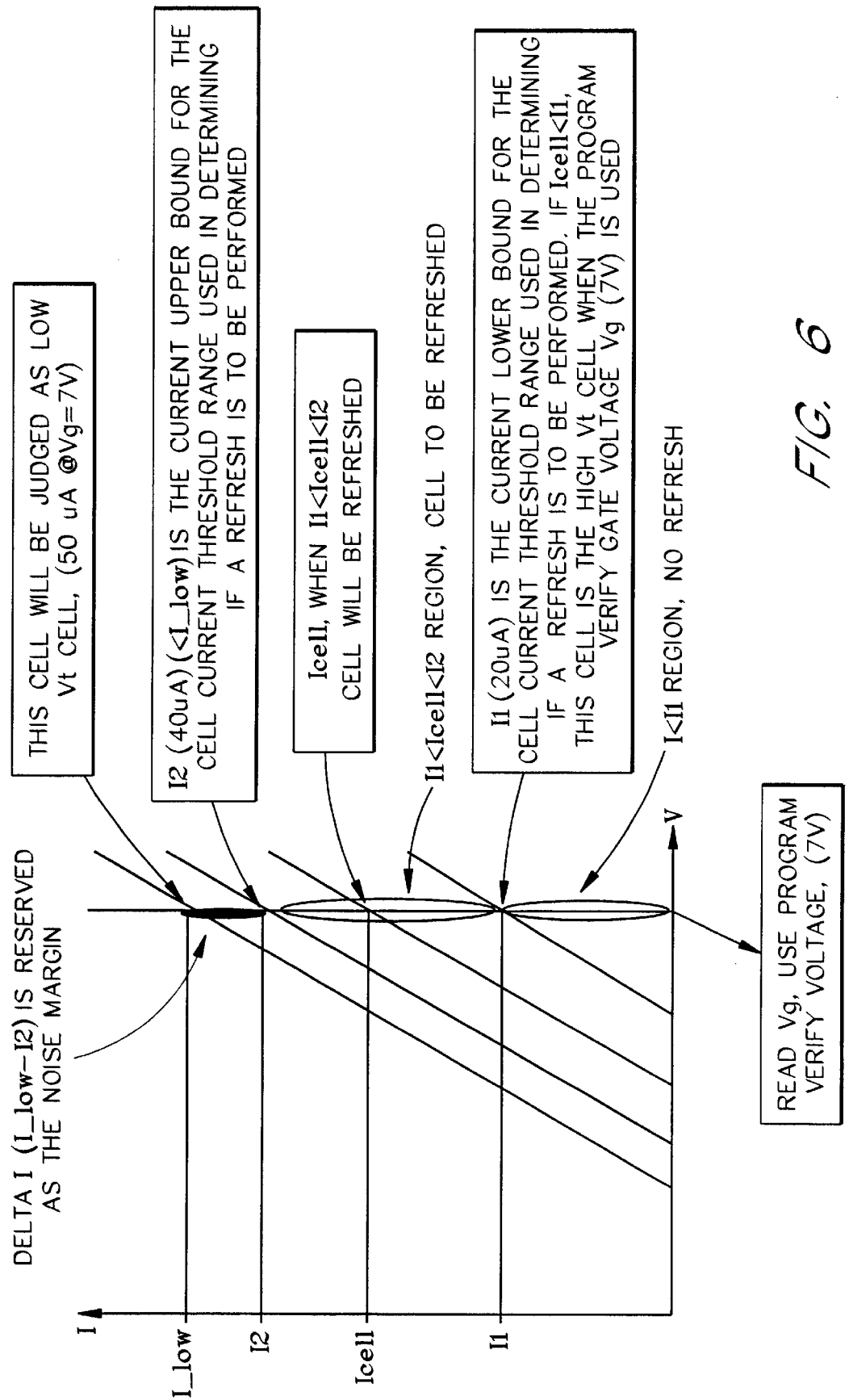
FIG. 6 illustrates an example I–V curve graph.

FIG. 6 illustrates an example Flash cell I–V curve graph for the cell current definition during the refresh determination process illustrated in FIG. 4B, and in particular, at states 406B and 408B. The example read voltage is 7V, the lower bound for the cell current Icell is I1 at 20 $\mu$A, and the upper bound for the cell current Icell is I2 at 40 $\mu$A. If I1<Icell<I2, the cell will be refreshed. If Icell<I1, then no refresh will be performed. Similarly, if Icell>I2, then no refresh will be performed.

Table 2 below describes example memory array operation modes.

TABLE 2

| Operation | Memory array operation mode | Flow |
| --- | --- | --- |
| 1 | Program whole sector (FLASH function) | Program whole sector → Program 1st wordline token bit |
| 2 | Rewrite one byte (EEPROM function) | Array cell byte erase → program array cell by byte → search for set token bit ("0") → Refresh token bit array wordline cell → Erase the currently set token bit → Program next wordline token bit |
| 3 | Sector erase only (erase by FLASH function) | Erase whole sector → Search for token bit → Erase this token bit |
| 4 | Sector erase and program whole sector (FLASH function = operation 3 + operation 1) | Erase whole sector → Search for token bit → Erase this token bit → Program whole sector → Program 1st word line token bit | endurance at −6.5V $V_g$ before needing to be refreshed, and if the array has 32 cells per bit line as illustrated in FIG. 2, then the refresh token will be transferred among 32 wordlines. The bytes which are to be refreshed include cells When programming a whole sector in FLASH mode, first the sector is programed, and then the first wordline token bit is programmed. In EEPROM byte mode, when one byte is to be rewritten, first the corresponding byte is erased. Then the byte is programmed. The refresh token bit is located, and the corresponding wordline cells are refreshed. The token bit may be associated with the wordline connected to the corresponding byte or may be associated with a different wordline. Thus, the token bit is independent of the wordline selected as part of a byte write operation. The refresh token bit is then erased or cleared, and the next wordline token bit is programmed.

When operating in FLASH mode, a sector erase is optionally performed as follows. First, the entire sector is erased. The refresh token bit is located. The refresh token bit is then erased. In other embodiments, the refresh token is not used in FLASH mode.

When operating in FLASH mode, a sector erase and sector program operation is preformed by first performing an erase sector operation and then performing a sector program operation, as follows: First, the entire sector is erased. The refresh token bit is located. The refresh token bit is erased and then the sector is programmed. The first wordline of the sector is associated with the refresh token bit. In other embodiments, the refresh token is not used in FLASH mode.

Thus as discussed above, embodiments of the present invention provide reliable and efficient methods for refresh non-volatile memories using a refresh token. In particular, a refresh process is embedded in a write operation, and a refresh token identifies which cells are to be evaluated to determine if the cells are to refreshed.

Although this invention has been described in terms of certain preferred embodiments, other embodiments that are apparent to those of ordinary skill in the art are also within the scope of this invention.

What is claimed is:

1. A method of refreshing non-volatile memory cells, the method comprising:
   locating a refresh token associated with a first wordline;
   determining if a first cell current for a first cell coupled to the first wordline is within a first range; and
   refreshing the first cell at least partly in response to determining that the first cell current is within the first range.

2. The method as defined in claim 1, wherein the action of refreshing the first cell is embedded in a write operation.

3. The method as defined in claim 1, wherein the refresh token is stored in a token cell coupled to the first wordline.

4. The method as defined in claim 1, wherein the first cell current is read with a gate of the first cell set to a program verify voltage.

5. The method as defined in claim 1, further comprising de-associating the refresh token from the first wordline and storing the refresh token is association with a second wordline.

6. The method as defined in claim 5, wherein the second wordline is adjacent to the first wordline.

7. The method as defined in claim 5, further comprising:
   determining that the refresh token is stored in association with the second wordline;
   determining if a second cell current for a second cell coupled to the second wordline is within the first range; and
   refreshing the second cell at least partly in response to determining that the second cell current is within the first range.

8. The method as defined in claim 5, further comprising:
   determining that the refresh token is stored in association with the second wordline;
   determining if a second cell current for a second cell coupled to the second wordline is outside of the first range;
   inhibiting the performance of a refresh for the second cell; and
   passing the refresh token to a third wordline.

9. A non-volatile memory circuit comprising:
   a first wordline coupled to a first row of memory data cells;
   a first refresh token cell coupled to the first wordline;
   a second wordline coupled to a second row of memory data cells;
   a second refresh token cell coupled to the second wordline; and
   a refresh circuit configured to pass a refresh token bit from the first refresh token cell to the second refresh token cell after a first memory operation.

10. The non-volatile memory circuit as defined in claim 9, wherein the refresh circuit is configured to measure at least a first current associated with at least a first memory cell coupled to the first wordline and to determine if the first cell is to be refreshed based at least in part on the measured first current.

11. The non-volatile memory circuit as defined in claim 9, wherein the refresh circuit is configured to erase the first refresh token cell before passing the refresh token to the second refresh token cell.

12. The non-volatile memory circuit as defined in claim 9, wherein a source terminal of the first refresh token cell, a source terminal of the second refresh token cell, and a source terminal of at least a first memory data cell in the row of memory data cells are coupled together.

13. The non-volatile memory circuit as defined in claim 9, wherein the first memory operation is a byte program operation.

14. A method of operating a non-volatile memory, the method comprising:
   performing an erase and program operation on a first byte coupled to a first wordline;
   performing a refresh of at least a first cell coupled to a second wordline, the refresh including:
      locating a refresh bit associated with a second wordline;
      refreshing a second cell, the second cell coupled to the second wordline;
      erasing the refresh bit; and
   associating the refresh bit with a third wordline.

15. The method as defined in claim 14, further comprising refreshing a row of cells coupled to the third wordline.

16. The method as defined in claim 14, further comprising measuring a cell current associated with the second cell before refreshing the second cell.

17. The method as defined in claim 14, further comprising determining if the second cell has been disturbed.

18. The method as defined in claim 14, wherein the non-volatile memory is a FLASH memory operated in an EEPROM mode.

19. The method as defined in claim 14, wherein the act of associating the refresh bit with the third wordline includes storing the refresh bit in a storage element coupled to the wordline.

20. A non-volatile memory circuit comprising:

a first conductor coupled to a first row of memory data cells;

a first refresh token storage element associated with the first row of memory data cells;

a second conductor coupled to a second row of memory data cells;

a second refresh token storage element associated with the second row of memory data cells; and a refresh circuit configured to pass a refresh token bit from the first refresh token storage element to the second refresh token storage element after a first memory operation.

21. The non-volatile memory circuit as defined in claim 20, wherein the first conductor is a wordline.

22. The non-volatile memory circuit as defined in claim 20, wherein the first refresh token storage element is coupled to the first conductor.

* * * * *